United States Patent [19]
Nagahori et al.

[11] Patent Number: 5,798,664
[45] Date of Patent: Aug. 25, 1998

[54] OFFSET CANCELLING AMPLIFIER CIRCUIT HAVING MILLER INTEGRATOR AS OFFSET DETECTOR

[75] Inventors: Takeshi Nagahori; Ichiro Hatakeyama; Soichiro Araki; Kazunori Miyoshi, all of Tokyo, Japan

[73] Assignee: NEC Corporation, Tokyo, Japan

[21] Appl. No.: 627,357

[22] Filed: Apr. 5, 1996

[30] Foreign Application Priority Data

Apr. 7, 1995 [JP] Japan .................................. 7-082882

[51] Int. Cl.$^6$ .............................. H03L 5/00; H03F 3/45
[52] U.S. Cl. ................................ 327/307; 330/259
[58] Field of Search ................................ 327/306, 307, 327/323, 336, 339, 345, 551, 552, 553, 558, 565; 330/259, 9, 294, 107

[56] References Cited

U.S. PATENT DOCUMENTS

| | | | |
|---|---|---|---|
| 3,634,770 | 1/1972 | Spreitzhofer | 327/58 |
| 4,119,960 | 10/1978 | Hill | 327/307 |
| 4,156,854 | 5/1979 | Weller | 330/259 |
| 4,502,017 | 2/1985 | Van De Plassche et al. | 330/151 |
| 4,578,646 | 3/1986 | Maio et al. | 327/307 |
| 4,720,723 | 1/1988 | Harunari et al. | 354/403 |
| 5,485,121 | 1/1996 | Huijsing et al. | 330/260 |

FOREIGN PATENT DOCUMENTS

| | | |
|---|---|---|
| 62-15909 | 1/1987 | Japan . |
| 2 122 831 | 1/1984 | United Kingdom . |

OTHER PUBLICATIONS

Chirlian, "Analysis and Design of Integrated Electronic Circuits". The integrator, pp. 640–642, 1981.

J.P. Moree et al., "A bipolar integrated continuous–time filter with optimized dynamic range", pp. 954–961, IEEE Journal of Solid–State Circuits, vol. 28, No. 9, Sep. 1, 1993.

V. Dufossez et al., "A low noise one chip playback record head amplifier for VCR", pp. 28–29, IEEE 1988 International Conference on Consumer Electronics, Jun. 8–10, 1988.

S.C. Thorp et al., "A high performance, highly integrated, 650 MBit/s Light to Logic PIN GaAS IC Optical receiver", pp. 336–339, Chalmers University of Technology, Sep. 10, 1989, Proceedings of the European Conference on Optical Communication.

*Primary Examiner*—Timothy P. Callahan
*Assistant Examiner*—My-Trang Nu Ton
*Attorney, Agent, or Firm*—Young & Thompson

[57] ABSTRACT

In an optical receiver, an offset cancelling amplifier comprises a limiting amplifier for amplifying an input signal while preventing amplified amplitude from exceeding a predetermined level to provide an output signal, an offset detector for detecting an offset in the output signal to produce a detection signal representative of the offset amount detected, and an offset controller coupled in the input circuit of the limiting amplifier and the offset detector for controlling an input voltage of the limiting amplifier in response to the detection signal to reduce the offset in the output signal. In order to widen the dynamic range and lower the low-frequency cutoff of the offset cancelling amplifier, the offset detector comprises a Miller integrator.

14 Claims, 6 Drawing Sheets

OFFSET CANCELLING AMPLIFIER CIRCUIT HAVING MILLER INTEGRATOR AS OFFSET DETECTOR

BACKGROUND OF THE INVENTION

This invention relates to an optical receiver circuit for use in optical communication, optical inter-connection, and the like and, in particular, to an offset cancelling amplifier used in the optical receiver circuit.

A conventional optical receiver circuit comprises a photodetector section responsive to an optical signal for converting the optical signal into a unipolar input current pulse signal and a polarity converter section for converting the unipolar input current pulse signal into a bipolar voltage pulse signal. In the prior art, the polarity converter section comprises a pre-amplifier or transimpedance amplifier and an offset cancelling amplifier circuit cascaded to the pre-amplifier and is integrated on a single chip. In this connection, the term "offset" involves both an internal offset occurring within the offset cancelling amplifier circuit and an external offset of an outside origin.

The optical receiver circuit with the offset cancelling amplifier circuit of the type described is disclosed, for example, in Japanese Patent Pre-examination Publication (A) No. 15909/1987 (Reference I).

The offset cancelling amplifier circuit shown in the Reference I comprises a limiting amplifier having an input circuit for amplifying an input signal incoming through the input circuit while preventing amplified amplitude from exceeding a predetermined level to provide an output signal, an offset detector for detecting an offset in the output signal to produce a detection signal representing an offset amount detected, and an offset controller coupled in the input circuit of the limiting amplifier and the offset detector for controlling an input voltage of the limiting amplifier in response to the detection signal to reduce or cancel the offset in the output signal.

The offset detector forms a feedback loop for feeding back the offset in the output signal to the input circuit. The offset detector comprises a CR integrator circuit including a capacitor and a resistor, and a feedback differential amplifier for acquiring a necessary and sufficient gain in a feedback loop.

In order that the offset cancelling amplifier circuit has a wide dynamic range, the offset in Its output signal must be reduced as much as possible. This is achieved by increasing the gain (C) of the feedback differential amplifier. While, a low-frequency cutoff or a lower side cutoff frequency of the offset detector is determined by $G/2\pi$ CR, that is a product of the gain (G) of the feedback differential amplifier and a low-frequency cutoff ($1/2\pi$ CR) of the CR integrator circuit. Thus, the low-frequency cutoff of the offset detector can not be lowered. As a result, the offset cancelling amplifier circuit cannot be obtained with the low-frequency cutoff of a lowered frequency as well as the wide dynamic range.

On the other hand, In order to lower the low-frequency cutoff $G/2\pi$ CR with the gain G kept at a high level, it can be proposed to increase the capacitance C of the capacitor or the resistance R of the resistor. However, this would arise another disadvantage. When the capacitance C is increased, the capacitor occupies an increased area on the IC chip. Thus, the increase of the capacitance C is not adapted for making the offset cancelling amplifier in a form of an integrated circuit. On the other hand, the increased resistance R of the resistor causes an increased voltage drop thereby and adversely affects circuit operation.

SUMMARY OF THE INVENTION

It is an object of this invention to provide an offset cancelling amplifier circuit having both a relatively wide or increased dynamic range and a lowered low-frequency cutoff.

According to this invention, an offset cancelling amplifier circuit is obtained which comprises a limiting amplifier having an input circuit for amplifying an input signal incoming through the input circuit while preventing amplified amplitude from exceeding a predetermined level to provide an output signal, an offset detector comprising a Miller integrator for detecting an offset in the output signal to produce a detection signal representing an offset amount detected, and an offset controller coupled in the input circuit of the limiting amplifier and the offset detector for controlling an input voltage of the limiting amplifier in response to the detection signal to reduce the offset in the output signal for offset cancellation.

The offset cancelling amplifier circuit of this invention has a low-frequency cutoff $1/2\pi$ CR which is determined by a capacitance C and a resistance R of the Miller integrator but is not dependent upon a gain of the Miller integrator. Accordingly, the offset cancelling amplifier circuit has the capacitor and the resistor of relatively low capacitance C and resistance R, respectively, and is therefore adapted for an integrated circuit with a widened dynamic range and a lowered low-frequency cutoff.

DESCRIPTION OF THE PREFERRED EMBODIMENT

Prior to description of an embodiment of this invention, a known offset cancelling amplifier circuit in an optical receiver disclosed in Reference I will at first be described with reference to the drawing.

Figure 1:
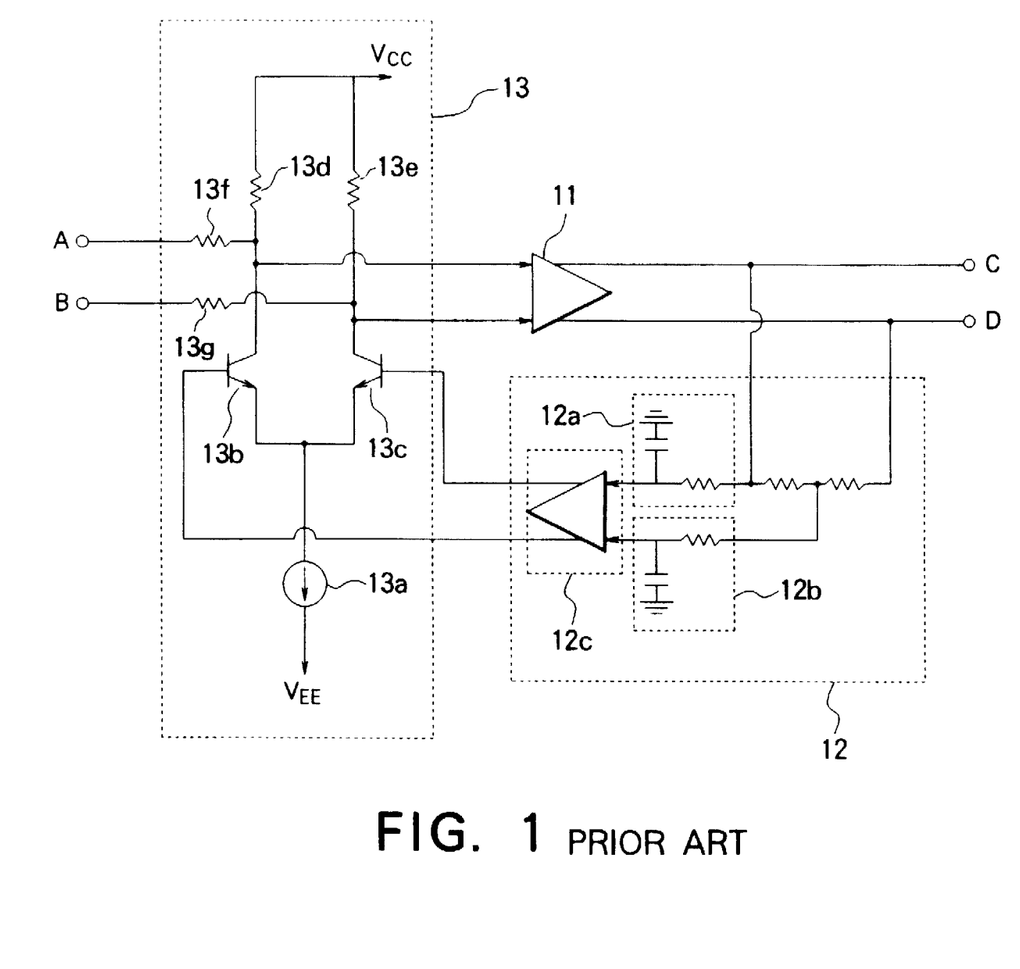
FIG. 1 shows a known offset cancelling amplifier circuit.

Referring to FIG. 1, the known offset cancelling amplifier circuit comprises a limiting amplifier 11, an offset detector 12, and an offset controller 13.

Supplied with an input voltage signal through a pair of input terminals A and B, the limiting amplifier 11 amplifies the input voltage signal into an amplified voltage signal while preventing the amplified amplitude from exceeding a predetermined level to produce an output voltage signal at a pair of output terminals C and D.

The input voltage signal comprises a pair of unipolar voltage signals, a first one derived from a photo-detection signal detected at a photodetector and applied to one input terminal A, the second one applied to the other terminal B and being an opposite polarity voltage signal having a polarity opposite to a polarity of the first unipolar voltage signal. Generally, an optical signal received in the optical receiver is a pulse signal having an average duty ratio or an average mark-to-space ratio of 50%, and therefore, the first unipolar voltage signal also has an average duty ratio of 50%.

The second unipolar voltage signal is a reference signal which may be a constant voltage signal of the opposite polarity or a unipolar voltage pulse signal similar to the first unipolar voltage signal but with the opposite polarity.

The output signal comprises a pair of bipolar signals, a first one delivered at one output terminal C, the second one delivered at the other output terminal D and having a reversed polarity in comparison to the first bipolar voltage signal.

The offset detector 12 is responsive to the output voltage signal and detects an offset in the output voltage signal to produce an offset detection signal representative of the offset amount detected. The offset detector 12 comprises a first CR integrator 12a, a second CR integrator 12b, and a feedback differential amplifier 12c.

The offset detector 12 detects a first time average of the first bipolar voltage signal at terminal C and a second time average of the second bipolar voltage signal at terminal D and provides, as the offset detection signal, a detection voltage signal representative of the first and the second time averages. The first and the second time average signals are equal to each other when the output signal has no offset.

The offset controller 13 is connected to an input circuit of the limiting amplifier 11 and is responsive to the offset detection signal for controlling a voltage at an input side of the limiting amplifier 11 to reduce or cancel the offset in the output signal of the limiting amplifier 11. The offset controller 13 comprises a current source 13a, a pair of transistors 13b and 13c, and two pairs of resistors 13d–13g.

In the known offset cancelling amplifier circuit shown in FIG. 1, the offset in the output signal of the limiting amplifier 11 is detected by the offset detector 12 and is fed back to the input side of the limiting amplifier 11. This offset cancelling amplifier has a disadvantage that the low-frequency cutoff can not sufficiently be lowered if a gain (G) of the feedback differential amplifier 12c is increased so as to widen a dynamic range of the offset cancelling amplifier. This is because the low-frequency cutoff G/2π CR is dependent upon the gain G of the feedback differential amplifier 12c of the offset detector 12, as described in the preamble of the specification.

Now, the description will proceed to an offset cancelling amplifier circuit according to one embodiment of this invention with reference to FIGS. 2 through 6. Similar parts are designated by like reference numerals as those described in conjunction with the known circuit in FIG. 1.

Figure 2:
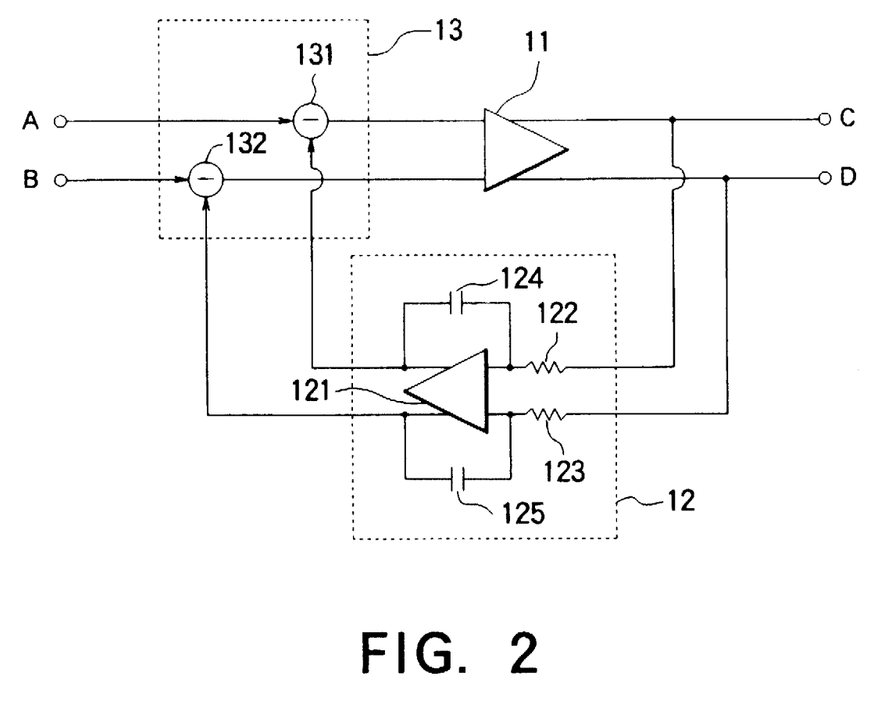
FIG. 2 shows an offset cancelling amplifier circuit according to this invention.

Referring to FIG. 2, the offset cancelling amplifier circuit according to one embodiment of this invention is similar to the known circuit of FIG. 1 and comprises the limiting amplifier 11 comprising a differential amplifier, the offset detector 12, and the offset controller 13. However, the offset cancelling amplifier circuit of this invention is different from the known circuit in that the offset detector 12 comprises a Miller integrator.

The limiting amplifier 11 is an amplitude-limiting amplifier. Supplied with the input voltage signal, the limiting amplifier 11 amplifies the input voltage signal into an amplified voltage signal while preventing an amplified amplitude from exceeding a predetermined level. The limiting amplifier 11 is implemented by a known differential amplifier.

The limiting amplifier 11 can be implemented by a single-stage differential amplifier. However, in order to obtain a sufficient gain for a low-energy signal, the limiting amplifier 11 preferably comprises a plurality of stages of the similar differential amplifiers connected in cascade. This is because the limiting amplifier comprising such multi-stage differential amplifiers connected in cascade achieves a high gain. In this structure, any circuit constant such as a source voltage is selected so that the first-stage differential amplifier is not saturated upon supply of a high-energy signal. In this event, the second and the subsequent differential amplifiers are prevented from being saturated. When the source voltage is selected as described above, the limiting amplifier 11 produces the output signal having an amplitude limited below the predetermined level in a wide dynamic range between a minimum input amplitude and a maximum input amplitude.

In the similar manner as in the known circuit of FIG. 1, the limiting amplifier 11 amplifies the input voltage signal incoming through input terminals A and B and produces the output signal at the output terminals C and D. The output signal comprises a pair of the first and the second bipolar voltage signals at terminals C and D, respectively.

The offset detector 12 comprises the Miller integrator for comparing time averages of the first and second bipolar voltage signals at terminals C and D to obtain a differential time average and for amplifying the differential time average to produce an offset detection signal. The Miller integrator comprises an amplifier 121, first and second input resistors 122 and 123 having one ends connected to input terminals of the amplifier 121, first and second feedback capacitors 124 and 125 connected between the output and the input terminals of the amplifier 121 to form feedback loops corresponding to the first and the second input resistors 122 and 123, respectively. The first and the second input resistors 122 and 123 have a same resistance R. The first and the second feedback capacitors 124 and 125 have a same capacitance C.

The offset detector (Miller integrator) 12 has an amplification gain G owing to the amplifier 121. The offset detector (Miller integrator) 12 has a time constant determined by the resistance R of the first and the second resistors 122 and 123 and the capacitance C of the first and the second feedback capacitors 124 and 125. By the use of the Miller integrator as the offset detector 12, it is possible to obtain those values amplified by the amplification gain G and averaged by the time constant.

In the offset cancelling amplifier circuit according to this invention, since the offset detector 12 comprises the Miller integrator as described above, the low-frequency cutoff of the offset cancelling amplifier circuit is determined by the time constant of the Miller integrator to be equal to ½π CR and is not dependent upon the gain G of the amplifier 121. Thus, the offset cancelling amplifier circuit of this invention is capable of both keeping the low-frequency cutoff at a lowered frequency and the dynamic range wide.

It is assumed here that the input unipolar voltage signals have an average duty ratio equal to 50%. In this event, the time averages of the first and the second bipolar voltage signals at terminals C and D are equal to each other. It is therefore possible to detect presence or absence of the offset with reference to the offset detection signal representative of the difference between the time averages.

The offset controller 13 is supplied with the offset detection signal from the offset detector 12 and controls an input voltage potential of the input signal to be supplied to the limiting amplifier 11 so as to cancel the offset in the output signal. The offset controller 13 comprises a first subtractor 131 and a second subtractor 132. The first subtractor 131 subtracts the first time average signal from the first unipolar voltage signal applied to the input terminal A. On the other hand, the second subtractor 132 subtracts the second time average signal from the second unipolar voltage signal applied to the input terminal B. Thus, the input signal controlled by the offset controller 13 is applied to the limiting amplifier 11.

When the limiting amplifier 11 comprises the multi-stage differential amplifiers connected in cascade, the differential amplifiers of the second and the subsequent stages are successively connected to the output terminals C and D in FIG. 2. As far as the input voltage potentials of the first-stage differential amplifier are controlled to desired potentials, input voltage potentials of differential amplifiers of the second and the subsequent stages need not be controlled, as described in the foregoing.

Next referring to FIGS. 3 through 5 in addition to FIG. 2, an operation of the offset cancelling amplifier circuit of FIG. 2 according to this invention will be described.

Figure 3:
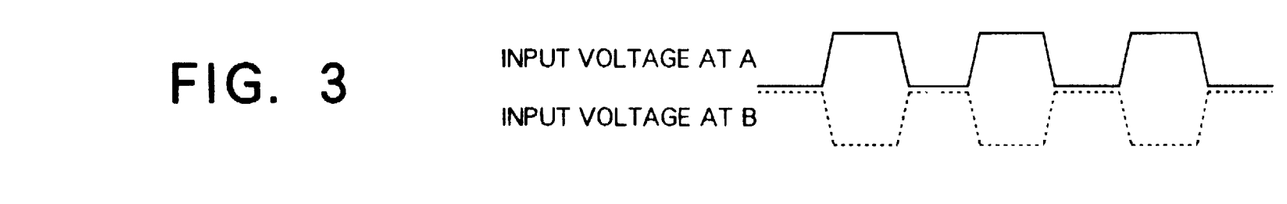
FIG. 3 shows an example of unipolar voltage signals supplied to the offset cancelling amplifier circuit in FIG. 2.
Figure 4:
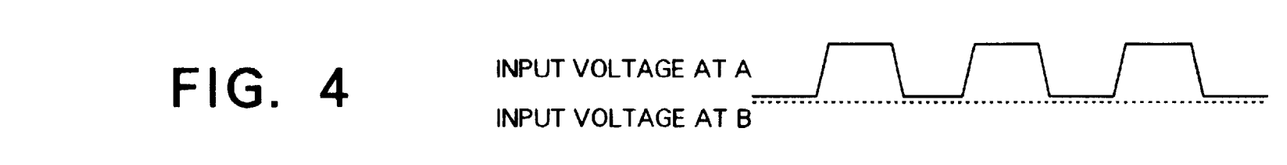
FIG. 4 shows another example of the unipolar voltage signals supplied to the offset cancelling amplifier circuit in FIG. 2.

As the input signal, a pair of unipolar voltage signals with opposite polarities or a pair of differential input signals having an external offset are supplied to the input terminals A and B, respectively, as illustrated in FIG. 3. Alternatively, a unipolar input signal can be supplied to the input terminal A but a constant voltage potential is maintained at the input terminal B, as illustrated in FIG. 4.

The input signal supplied to the input terminals A and B are sent through the offset controller 13 to the limiting amplifier 11. The limiting amplifier 11 amplifies the input signal at a predetermined amplification factor into amplified signals with an amplitude limited so as not to exceed a predetermined level. The operation of the limiting amplifier 11 will hereafter be referred to as a limiting amplification operation.

Figure 5:
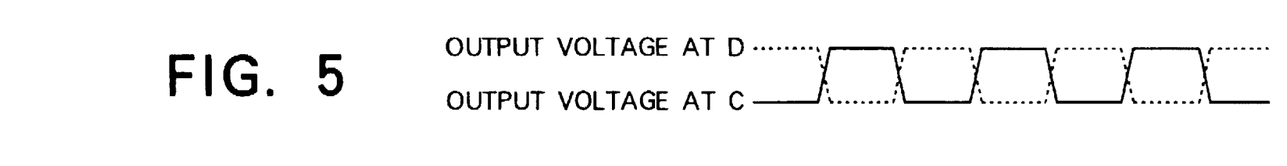
FIG. 5 shows an example of bipolar voltage signals produced by the offset cancelling amplifier circuit in FIG. 2.

Referring to FIG. 5, the output signal after the limiting amplification operation is delivered to the output terminals C and D. As illustrated in FIG. 5, the output signal comprises a pair of bipolar voltage signals having reversed polarities to each other which are present at output terminals C and D, respectively.

When the output signal has an offset, the offset detector 12 produces an offset detection signal representative of a detected offset amount and supplies the offset detection signal to the offset controller 13.

In response to the offset detection signal, the offset controller 13 controls the input voltage signal, more specifically, the input voltage potentials of the pair of unipolar voltage signals supplied to the input terminals A and B so as to cancel the offset present in the output signal.

Supplied with the input signal controlled by the offset controller 13, the limiting amplifier 11 performs the limiting amplification operation and produces the output signal at the output terminals C and D. Thus, the offset in the output signal is reduced or cancelled.

Figure 6:
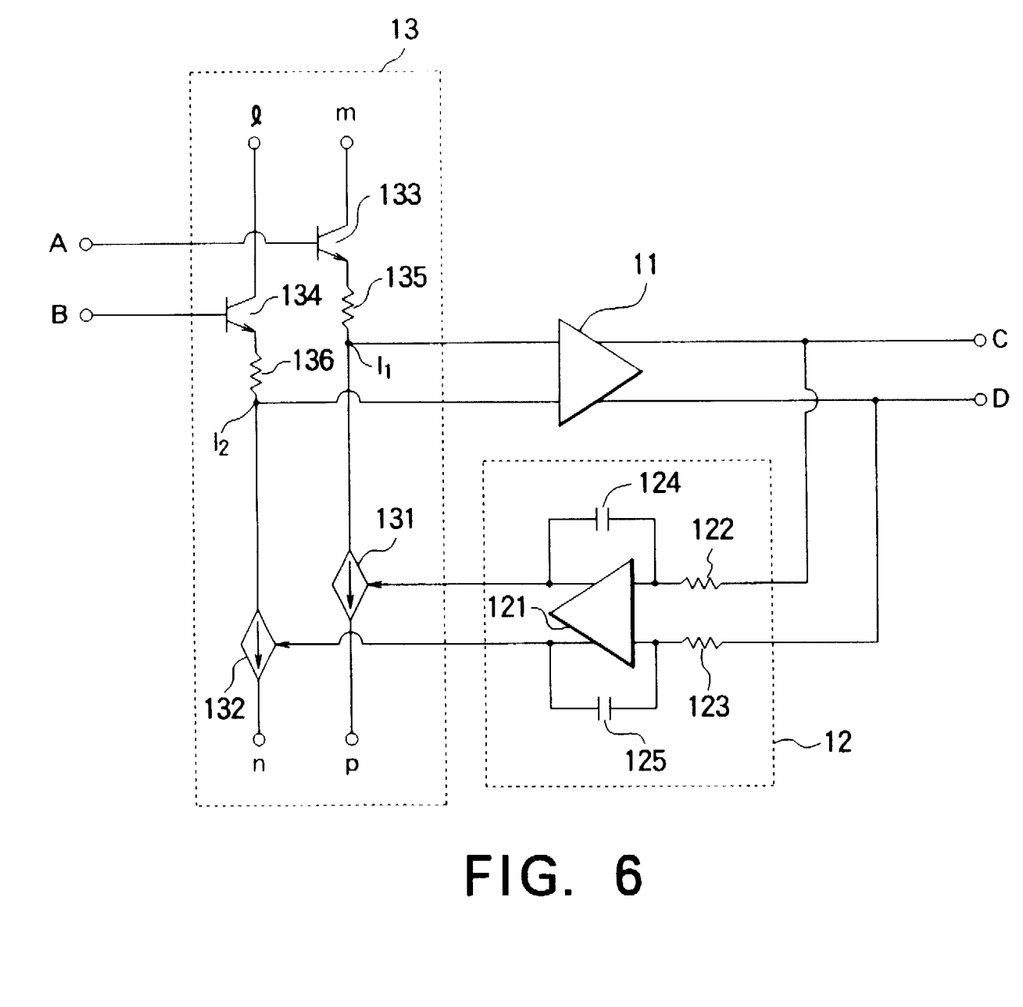
FIG. 6 shows in detail a structure of an offset controller in the offset cancelling amplifier circuit in FIG. 2.

Referring to FIG. 6, the offset cancelling amplifier according to another embodiment of this invention includes a specific example of the offset controller 13 comprises first and second controllable current sources 131 and 132, first and second transistors 133 and 134, and first and second resistors 135 and 136. The first and the second controllable current sources 131 and 132 are controlled by the offset detection signal, in detail, the first and the second time average signals of the offset detector 12, respectively. The first transistor 133 has a base connected to the input terminal A. The second transistor 134 has a base connected to the input terminal B. The first resistor 135 has one end connected to the first controllable current source 131 and the other end connected to an emitter of the first transistor 133. The second resistor 136 has one end connected to the second controllable current source 132 and the other end connected to an emitter of the second transistor 134.

The offset controller 13 has power supply terminals l, m, n and p.

A common connection point I1 between the first controllable current source 131 and the first resistor 135 and another common connection point I2 between the second controllable current source 132 and the second resistor 136 are connected to the limiting amplifier 11.

In the offset controller 13, the pair of first and second opposite polarity voltage signals at A and B are amplified and present at the connection points at I1 and I2, respectively. On the other hand, the first and the second controllable current sources 131 and 132 are controlled by the offset detection signal. As a result, the voltage potentials at connection points at I1 and I2 are controlled by the offset detection signal. Thus, the input signal is controlled by the the offset controller 13 in response to the offset detection signal and is applied to the limiting amplifier 11.

It will be understood that the offset controller 13 applicable to the offset cancelling amplifier circuit of this invention is not restricted to the offset controller illustrated in FIG. 6 and may have various structures. The offset controller 13 shown in FIG. 1 is also applicable to the offset cancelling amplifier of this invention.

Now, description will be made as regards a combination of a photo-detector section 14 and a pre-amplifier section 15, which should be connected to the offset cancelling amplifier circuit to form an optical receiver circuit.

Figure 7:
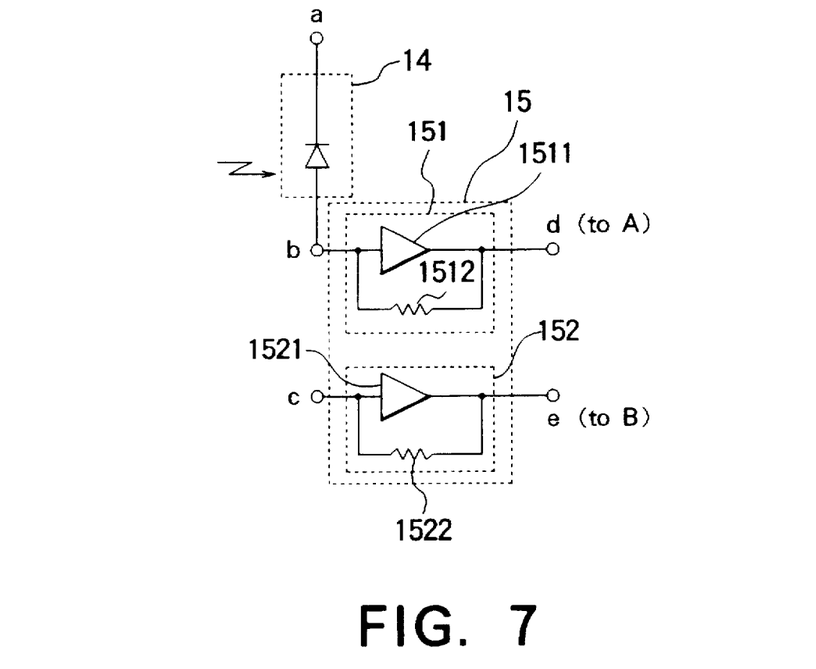
FIG. 7 shows a combination of a pre-amplifier section and a photodetector section which should be coupled with the offset cancelling amplifier circuit in FIG. 2 to form an optical receiver circuit.

Referring to FIG. 7, the photo-detector section 14 comprises a photo-detector element such as a photo-diode. The pre-amplifier section 15 comprises first and second pre-amplifiers 151 and 152. The first pre-amplifier 151 comprises a first amplifier 1511 and a first feedback resistor 1512. Likewise, the second pre-amplifier 152 comprises a second amplifier 1521 and a second feedback resistor 1522.

The photo-detector section 14 is connected to a power source (not shown) through a terminal a. The photo-detector section 14 is connected through a terminal b to the first pre-amplifier 151. The second pre-amplifier 152 is connected through a terminal c to a reference signal source (not shown) for producing a predetermined reference signal. The first pre-amplifier 151 is connected via a terminal d to the input terminal A of the offset cancelling amplifier circuit described before. The second pre-amplifier 152 Is connected via a terminal e to the input terminal B of the offset cancelling amplifier circuit.

Supplied with an optical signal, the photo-detector 14 converts the optical signal into an input current pulse signal to deliver the input current pulse signal to the terminal b. Supplied through the terminal b with the input current pulse signal, the first pre-amplifier 151 amplifies and converts the input current signal into a unipolar voltage signal which is applied to the input terminal A of the offset cancelling amplifier circuit of FIG. 2 through the terminal d. On the other hand, supplied through the terminal c with the predetermined reference signal, the second pre-amplifier 152 amplifies and converts the predetermined reference signal into a unipolar reference voltage signal which is applied to the input terminal B of the offset cancelling amplifier circuit of FIG. 2 through the the terminal e. Thus, by the use of such a combination of the photo-detector section 14 and the pre-amplifier section 15, the input terminals A and B of the offset cancelling amplifier circuit are supplied with the unipolar voltage signals as illustrated in FIG. 3 or FIG. 4. When the reference signal applied through terminal c is a pulse signal, the unipolar voltage signals are as shown in FIG. 3. When the reference signal is a constant voltage signal, the unipolar voltage signal is as shown in FIG. 4.

Figure 8:
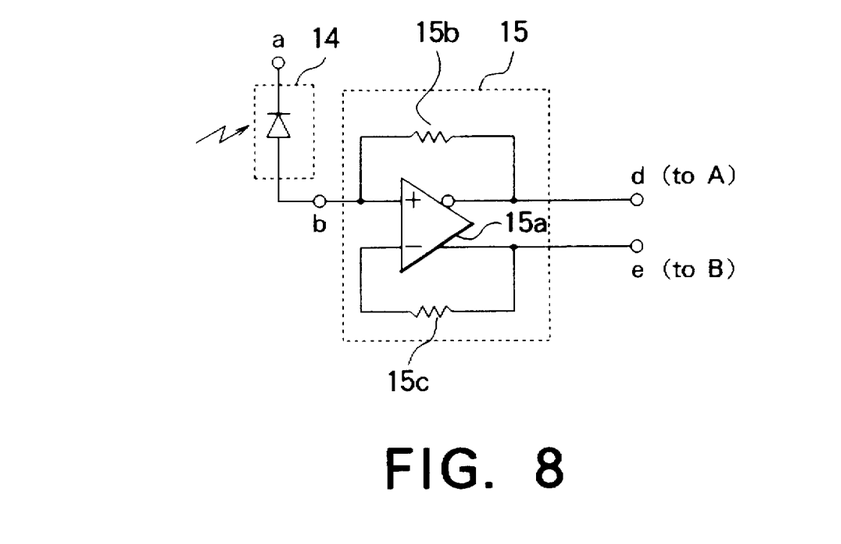
FIG. 8 shows another combination of a pre-amplifier section and a photodetector section which should be coupled with the offset cancelling amplifier circuit in FIG. 2 to form an optical receiver circuit.

Referring to FIG. 8, another example of the pre-amplifier section 15 is shown together with the photo-detector section 14 connected thereto. The pre-amplifier section 15 of this example comprises a differential amplifier 15a and first and second feedback resistors 15b and 15c. In FIG. 8, those terminals connected in the similar manner as described in conjunction with FIG. 7 are designated by like reference symbols.

The pre-amplifier section 15 Illustrated in FIG. 8 carries out an operation basically similar to that of the pre-amplifier section 15 illustrated in FIG. 7. However, the pre-amplifier section 15 in FIG. 8 comprises a single one of the differential amplifier 15a which amplifies the input current pulse signal from the photo-detector section 14 to produce a pair of differential signals. The differential signals are applied to, as the first and the second unipolar voltage signals as shown in FIG. 3, the input terminals A and B of the offset cancelling amplifier circuit.

Figure 9:
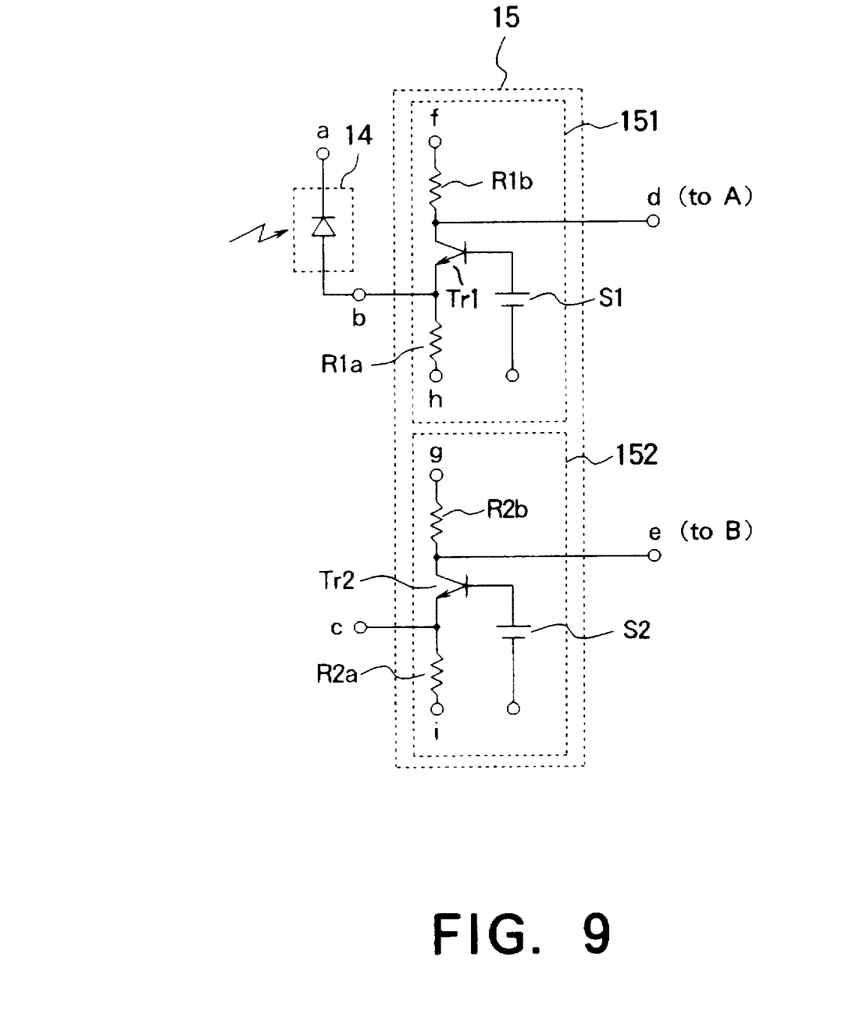
FIG. 9 shows still another combination of a pre-amplifier section and a photodetector section which should be coupled with the offset cancelling amplifier circuit in FIG. 2 to form an optical receiver circuit.

Referring to FIG. 9, another example of the pre-amplifier section 15 is shown together with the photo-detector section 14 connected thereto.

A pre-amplifier section 15 comprises first and second pre-amplifiers 151 and 152. The first pre-amplifier 151 comprises a first transistor Tr1 having an emitter and a collector which are connected to opposite terminals f and h of a power source (not shown) through a first and a second resistors R1a and R1b The transistor Tr1 has a base which is connected to a voltage source S1 illustrated as an electric cell. A connection point between the emitter of the transistor Tr1 and the first resistor R1a is connected to the photo-detector section 14 through an input terminal b Another connection point between the collector of the transistor Tr1 and the second resistor R1b is connected to an output terminal d which is connected to an input terminal A of the offset cancelling amplifier of FIG. 2.

The second pre-amplifier 152 has a similar structure and comprises a transistor Tr2 having an emitter and a collector which are connected to opposite terminals g and i of a power source (not shown) through first and second resistors R2a and R2b. The transistor Tr2 has a base which is connected to a voltage source S2 illustrated as an electric cell. A connection point between the emitter of the transistor Tr2 and the first resistor R2a is connected to the reference signal source (not shown) through an input terminal c. Another connection point between the collector of the transistor Tr2 and the second resistor R2b is connected to an output terminal e which is connected to an input terminal B of the offset cancelling amplifier of FIG. 2.

The pre-amplifier section 15 of this example carries out an operation basically similar to that of the pre-amplifier section 15 illustrated in FIG. 7. Accordingly, the input terminals A and B of the offset cancelling amplifier circuit are supplied with the unipolar voltage signals as illustrated in FIG. 3 or FIG. 4.

The photo-detector section illustrated in FIGS. 7 through 9 may have any other structure as far as an optical signal is converted into a current signal. Similarly, the pre-amplifier section is not restricted to those described in conjunction with FIGS. 7 through 9.

A combination of any one of the pre-amplifier sections shown in FIGS. 1, 2, 7, 8 and 9 and the offset cancelling amplifier circuit of this invention described above forms a polarity converter section for converting a unipolar input current pulse signal into a bipolar voltage pulse signal.

A combination of the photo-detector section 4, any one of the pre-amplifier sections of FIGS. 1, 2, 7, 8 and 9, and the offset cancelling amplifier circuit of this invention forms an optical receiver circuit for converting an optical signal into a bipolar voltage pulse signal with an offset reduced or cancelled therefrom.

The optical receiver circuit according to this invention may be implemented wholly by assembling individual components. However, the optical receiver circuit is fully effective if a part of the optical receiver circuit is integrated on an IC chip as an integrated circuit.

As described above, the offset cancelling amplifier circuit according to this invention has the low-frequency cutoff ½π CR which is not dependent upon the gain G of the amplifier 121 of the offset detector 12. Thus, the offset cancelling amplifier circuit meets the demand for both the wide dynamic range and the low-frequency cutoff of a lowered frequency.

What is claimed is:

1. An offset cancelling amplifier circuit comprising;
   a limiting amplifier having an input for amplifying an input signal incoming through said input while preventing amplified amplitude from exceeding a predetermined level to provide an output signal;
   an offset detector comprising only one Miller integrator for detecting an offset in said output signal to produce a detection signal representative of the offset amount detected; and
   an offset controller coupled between said input of said limiting amplifier and said detection signal of said offset detector for controlling said input of said limiting amplifier in response to said detection signal to reduce said offset in said output signal.

2. An offset cancelling amplifier circuit as claimed claim 1, wherein said limiting amplifier comprises at least one differential amplifier.

3. An offset cancelling amplifier circuit as claimed in claim 1, wherein said offset controller comprises a subtractor.

4. An offset cancelling amplifier circuit as claimed in claim 1, wherein said offset cancelling amplifier circuit is an integrated circuit formed on a single common chip.

5. An optical receiver circuit comprising:
   a photodetector section responsive to an optical signal for converting the optical signal into an input current signal;
   a pre-amplifier section comprising at least one pre-amplifier responsive to the input current signal for converting the input current signal into an input voltage signal;

a limiting amplifier having an input for amplifying the input voltage signal incoming through said input while preventing amplified amplitude from exceeding a predetermined level to provide an output signal;

an offset detector comprising only one Miller integrator for detecting an offset in said output signal to produce a detection signal representing an offset amount detected; and an offset controller coupled between said input of said limiting amplifier and said detection signal of said offset detector for controlling said input of said limiting amplifier in response to said detection signal to reduce or cancel said offset in said output signal.

6. An optical receiver circuit as claimed in claim 5, wherein said limiting amplifier comprises at least one differential amplifier.

7. An optical receiver circuit as claimed in claim 5, wherein said offset controller comprises a subtractor.

8. A polarity converter circuit for converting a unipolar input current pulse signal into a bipolar input voltage pulse signal, comprising:

a pre-amplifier section including at least one pre-amplifier for converting the unipolar input current pulse signal into unipolar input voltage pulse signal;

a limiting amplifier having an input for amplifying the unipolar input voltage pulse signal incoming through said input while preventing amplified amplitude from exceeding a predetermined level to produce an output signal of a bipolar voltage pulse signal;

an offset detector comprising only one Miller integrator for detecting an offset in said output signal to produce a detection signal representative of the offset amount detected; and an offset controller coupled between said input of said limiting amplifier and said detection signal of said offset detector for controlling said input of said limiting amplifier in response to said detection signal reduce said offset in said output signal.

9. A polarity converter circuit as claimed in claim 8, wherein said limiting amplifier comprises at least one differential amplifier.

10. A polarity converter circuit as claimed in claim 8, wherein said offset controller comprises a subtractor.

11. A polarity converter circuit as claimed in claim 8, wherein said polarity converter circuit is an integrated circuit formed on a single common chip.

12. An optical receiver circuit comprising:

a photodetector section responsive to an optical signal for converting the optical signal into a unipolar input current pulse signals;

a pre-amplifier section comprising at least one pre-amplifier for converting the unipolar input current pulse signal into a unipolar input voltage pulse signal;

a limiting amplifier having an input for amplifying the unipolar input voltage pulse signal incoming through said input while preventing amplified amplitude from exceeding a predetermined level to produce an output signal of a bipolar voltage pulse signal;

an offset detector comprising only one Miller integrator for detecting an offset in said output signal to produce a detection signal representative of the offset amount detected; and an offset controller coupled between said input of said limiting amplifier and said detection signal of said offset detector for controlling said input of said limiting amplifier in response to said detection signal to reduce said offset in said output signal.

13. An optical receiver circuit as claimed in claim 12, wherein said limiting amplifier comprises at least one differential amplifier.

14. An optical receiver circuit as claimed in claim 12, wherein said offset controller comprises a subtractor.

* * * * *